United States Patent
Luning et al.

(10) Patent No.: US 7,977,174 B2
(45) Date of Patent: Jul. 12, 2011

(54) FINFET STRUCTURES WITH STRESS-INDUCING SOURCE/DRAIN-FORMING SPACERS AND METHODS FOR FABRICATING THE SAME

(75) Inventors: Scott Luning, Poughkeepsie, NY (US); Frank Scott Johnson, Wappinger Falls, NY (US); Michael J. Hargrove, Clinton Corners, NY (US)

(73) Assignee: Globalfoundries Inc., Grand Cayman (KY)

( * ) Notice: Subject to any disclaimer, the term of this patent is extended or adjusted under 35 U.S.C. 154(b) by 120 days.

(21) Appl. No.: 12/480,269

(22) Filed: Jun. 8, 2009

(65) Prior Publication Data

US 2010/0308381 A1 Dec. 9, 2010

(51) Int. Cl.
*H01L 21/00* (2006.01)
(52) U.S. Cl. ............... 438/157; 438/176; 257/E29.137
(58) Field of Classification Search .................. 438/149, 438/151, 176, 197, 157, 478, 479, 481; 257/347, 257/E29.137, E29.298
See application file for complete search history.

(56) References Cited

U.S. PATENT DOCUMENTS

| 6,803,631 | B2 | 10/2004 | Dakshina-Murthy et al. |
| 7,101,763 | B1 | 9/2006 | Anderson et al. |
| 7,829,466 | B2 * | 11/2010 | Johnson et al. ............ 438/703 |
| 2004/0113217 | A1 | 6/2004 | Chidambarrao et al. |
| 2006/0017119 | A1 | 1/2006 | Jin et al. |
| 2006/0017138 | A1 | 1/2006 | Ting |
| 2006/0022268 | A1 | 2/2006 | Oh et al. |
| 2006/0094194 | A1 | 5/2006 | Chen et al. |
| 2010/0118599 | A1 * | 5/2010 | Marshall et al. ............ 365/154 |

OTHER PUBLICATIONS

Choi, Y-K., et al. "Nano-scale CMOS Technology for the Terabit Era," IEEE Semiconductor Device Research Symposium, 2001 International Dec. 5-7, 2001, Piscataway, NJ, USA. Dec. 5, 2001. pp. 543-546.
PCT International Search Report for PCT/US2010/037109 mailed Jul. 15, 2010.

* cited by examiner

*Primary Examiner* — Brook Kebede
(74) *Attorney, Agent, or Firm* — Ingrassia Fisher & Lorenz, P.C.

(57) ABSTRACT

Methods for fabricating FinFET structures with stress-inducing source/drain-forming spacers and FinFET structures having such spacers are provided herein. In one embodiment, a method for fabricating a FinFET structure comprises fabricating a plurality of parallel fins overlying a semiconductor substrate. Each of the fins has sidewalls. A gate structure is fabricated overlying a portion of each of the fins. The gate structure has sidewalls and overlies channels within the fins. Stress-inducing sidewall spacers are formed about the sidewalls of the fins and the sidewalls of the gate structure. The stress-inducing sidewall spacers induce a stress within the channels. First conductivity-determining ions are implanted into the fins using the stress-inducing sidewall spacers and the gate structure as an implantation mask to form source and drain regions within the fins.

20 Claims, 8 Drawing Sheets

FINFET STRUCTURES WITH STRESS-INDUCING SOURCE/DRAIN-FORMING SPACERS AND METHODS FOR FABRICATING THE SAME

FIELD OF THE INVENTION

The present invention generally relates to semiconductor devices and methods for fabricating semiconductor devices, and more particularly relates to FinFET structures with stress-inducing source/drain-forming spacers and methods for fabricating the same.

BACKGROUND OF THE INVENTION

In contrast to traditional planar metal-oxide-semiconductor field-effect transistors (MOSFETs), which are fabricated using conventional lithographic fabrication methods, nonplanar FETs incorporate various vertical transistor structures. One such semiconductor structure is the "FinFET," which takes its name from the multiple thin silicon "fins" that are used to form the respective gate channels, and which are typically on the order of tens of nanometers in width.

More particularly, referring to the exemplary prior art non-planar FET structure shown in FIG. 1, a FinFET 100 generally includes two or more parallel silicon fin structures (or simply "fins") 104 and 106. These structures are typically formed using a silicon-on-insulator (SOI) substrate (not shown), with fins 104 and 106 extending between a common drain electrode and a common source electrode (not shown). A conductive gate structure 102 "wraps around" three sides of both fins 104 and 106, and is separated from the fins by a standard gate oxide layer 103. While FIG. 1 illustrates only one gate structure 102 wrapped around fins 104 and 106, two, three or more parallel gate structures can be wrapped around the fins. Fins 104 and 106 may be suitably doped to produce the desired FET polarity, as is known in the art, such that a gate channel is formed within the near surface of the fins adjacent to gate oxide 103. The width of the gate, indicated by double-headed arrow 108, determines the effective channel length of the device.

While the use of stress-inducing materials is a well-known technique to increase the mobility of carriers within gate channels of planar MOSFETs, the use of such materials in FinFET structures is more difficult because of the small dimensions of FinFET features. As such devices decrease in dimension but increase in function, the pitch of parallel gates typically decreases because of the number of gates needed in a given area. In turn, as the gate pitch decreases, so too do the areas of the fins between the parallel gates. The small areas between the gates limit the width of source/drain-forming spacers that can be formed about the gates. If the width of the source/drain-forming spacers is too small, subsequently-formed source/drain regions in these areas can encroach into the channels underlying the gates, causing device failure. In addition, such small source/drain regions make it difficult to uniformly deposit an adequate amount of stress-inducing material between the gates to induce stress in the channels.

Accordingly, it is desirable to provide methods for fabricating scalable FinFET structures with stressed source/drain regions. In addition, it is desirable to provide methods for fabricating FinFET structures with stress-inducing source/drain-forming spacers. It is also desirable to provide FinFET structures with stress-inducing source/drain-forming spacers. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for fabricating FinFET structures with stress-inducing source/drain-forming spacers and FinFET structures having such spacers are provided herein. In accordance with an exemplary embodiment of the present invention, a method for fabricating a FinFET structure comprises fabricating a plurality of parallel fins overlying a semiconductor substrate. Each of the plurality of parallel fins has sidewalls. A gate structure is fabricated overlying a portion of each of the plurality of parallel fins. The gate structure has sidewalls and overlies channels within the plurality of parallel fins. Stress-inducing sidewall spacers are formed about the sidewalls of the plurality of parallel fins and the sidewalls of the gate structure. The stress-inducing sidewall spacers induce a stress within the channels. First conductivity-determining ions are implanted into the plurality of parallel fins using the stress-inducing sidewall spacers and the gate structure as an implantation mask to form source and drain regions within the plurality of parallel fins.

In accordance with another exemplary embodiment, a method for fabricating a FinFET structure comprises fabricating parallel fins overlying a semiconductor substrate. Each of the parallel fins has sidewalls. A gate structure having sidewalls is fabricated overlying a first portion of each of the parallel fins with a second portion of each of the parallel fins exposed. First stress-inducing sidewall spacers are formed about the sidewalls of a first plurality of the parallel fins and the sidewalls of a first portion of the gate structure. Second stress-inducing sidewall spacers are formed about the sidewalls of a second plurality of the parallel fins and the sidewalls of a second portion of the gate structure. The first stress-inducing sidewall spacers and the second stress-inducing sidewall spacers induce opposite stresses. First conductivity-determining ions are implanted into the second portion of the first plurality of the parallel fins using the first stress-inducing sidewall spacers and the first portion of the gate structure as an implantation mask to form first source and drain regions. Second conductivity-determining ions are implanted into the second portion of the second plurality of the parallel fins using the second stress-inducing sidewall spacers and the second portion of the gate structure as an implantation mask to form second source and drain regions. The first conductivity-determining ions are of an opposite conductivity than the second conductivity-determining ions.

In a further exemplary embodiment of the present invention, a FinFET structure comprises a plurality of parallel fins overlying a semiconductor substrate. Each of the plurality of parallel fins has sidewalls. A gate structure having sidewalls overlies a first portion of each of the plurality of parallel fins. Source and drain regions are disposed within a second portion of each of the plurality of parallel fins. Stress-inducing sidewall spacers are about the sidewalls of the second portion of each of the plurality of parallel fins and about the sidewalls of the gate structure. The stress-inducing sidewall spacers have a width such that the source and drain regions do not encroach upon a channel of each of the plurality of parallel fins underlying the gate structure.

BRIEF DESCRIPTION OF THE DRAWINGS

The present invention will hereinafter be described in conjunction with the following drawing figures, wherein like numerals denote like elements, and wherein:

FIGS. 2-26 illustrate a FinFET structure and methods for fabricating a FinFET structure with stress-inducing source/drain-forming spacers, in accordance with various exemplary embodiments of the present invention, wherein:

FIGS. 2-7 are cross-sectional views of the FinFET structure of FIGS. 2-26 taken along the same axis;

FIGS. 8-9 are cross-sectional views of the FinFET structure of FIG. 7 taken along the 8-8 axis;

FIG. 10 is a top view of the FinFET structure of FIG. 9;

FIG. 11 is a top view of the FinFET structure of FIG. 10 after various method steps;

FIG. 12 is a cross-sectional view of the FinFET structure of FIG. 11 taken along the 12-12 axis;

FIG. 13 is a cross-sectional view of the FinFET structure of FIG. 11 taken along the 13-13 axis;

FIG. 14 is a cross-sectional view of the FinFET structure of FIG. 12, taken along the same axis, after various method steps;

FIG. 15 is a cross sectional view of the FinFET structure of FIG. 14 taken along the 15-15 axis;

FIG. 16 is a cross-sectional view of the FinFET structure of FIG. 14, taken along the same axis, after various method steps;

FIG. 17 is a cross sectional view of the FinFET structure of FIG. 16 taken along the 17-17 axis;

FIG. 18 is a cross sectional view of the FinFET structure of FIG. 16 taken along the 18-18 axis;

FIG. 19 is a cross-sectional view of the FinFET structure of FIG. 16, taken along the same axis, after various method steps;

FIG. 20 is a cross sectional view of the FinFET structure of FIG. 19 taken along the 20-20 axis;

FIG. 21 is a cross sectional view of the FinFET structure of FIG. 19 taken along the 21-21 axis;

FIG. 22 is a cross-sectional view of the FinFET structure of FIG. 19, taken along the same axis, after various method steps;

FIG. 23 is a cross sectional view of the FinFET structure of FIG. 22 taken along the 23-23 axis;

FIG. 24 is a cross-sectional view of the FinFET structure of FIG. 22, taken along the same axis, after various method steps;

FIG. 25 is a cross sectional view of the FinFET structure of FIG. 24 taken along the 25-25 axis; and FIG. 26 is an isometric view of the FinFET structure of FIG. 25, after various method steps.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 2-26 illustrate methods for fabricating FinFET structures with stress-inducing source/drain-forming spacers between parallel gates, in accordance with exemplary embodiments of the present invention. The stress-inducing source/drain-forming spacers perform at least two principal functions. The source/drain-forming spacers serve not only to space source/drain regions so that they do not encroach upon the channels of the fins underlying the gates but also serve to induce stress into the channels. In this regard, a scalable FinFET device with enhanced device performance can be achieved.

Figure 1:
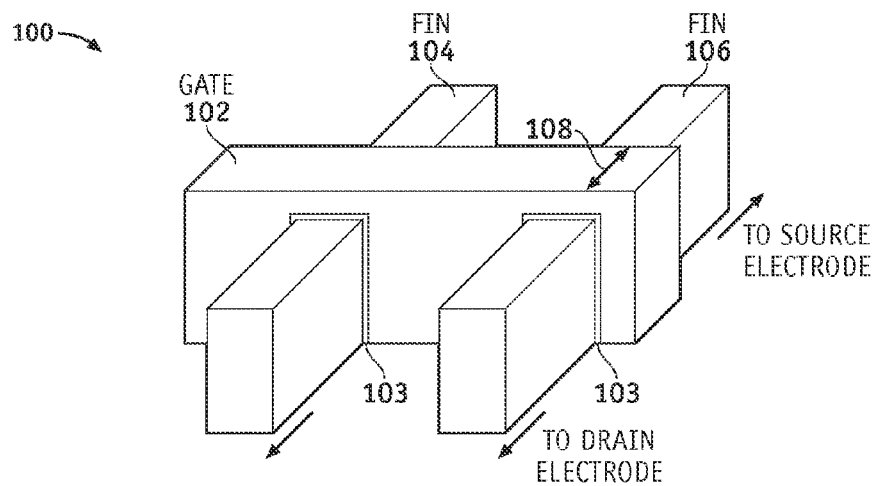
FIG. 1 is an isometric schematic view of a FinFET structure available in the prior art.
Figure 2:
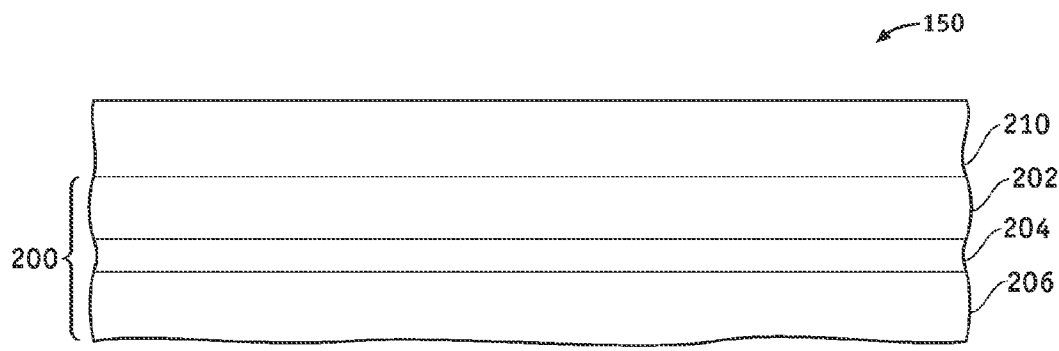

Referring to FIG. 2, in accordance with exemplary embodiments of the present invention, methods for fabricating a FinFET structure 150 include the step of providing a semiconductor substrate 200. As used herein, the term "semiconductor substrate" will be used to encompass semiconductor materials conventionally used in the semiconductor industry from which to make electrical devices. "Semiconductor materials" include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may comprise a silicon-comprising material 202 disposed on a silicon oxide material 204, commonly known as a silicon-on-insulator (SOI) structure that, in turn, is supported by a support substrate 206. The semiconductor substrate 200 may further comprise any other material layers overlying silicon-comprising material 202, such as insulator layers, mask layers, and the like. A mandrel-forming material layer 210 is deposited on the semiconductor substrate 200. Examples of suitable materials for the mandrel-forming material layer 210 include, but are not limited to polycrystalline silicon, silicon oxide, silicon nitride, and the like.

Figure 3:
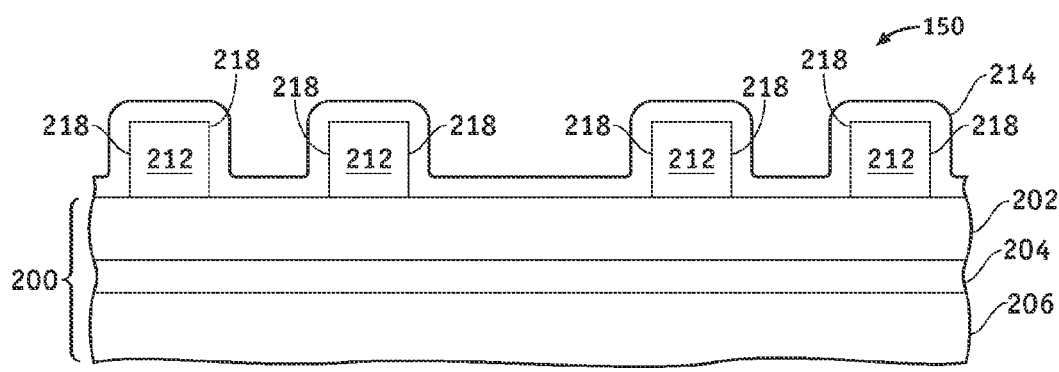

Referring to FIG. 3, after deposition of the mandrel-forming material layer 210, one or more patterned masks (not shown), such as one or more patterned photoresists, is formed on the mandrel-forming material layer 210, which then is etched to form a plurality of sacrificial mandrels 212, each having sidewalls 218. This etch may be performed by, for example, plasma or reactive ion etching (RIE) using chemistries based upon carbon trifluoride/oxygen ($CHF_3/O_2$) to etch silicon nitride, $CHF_3$ or carbon tetrafluoride ($CF_4$) to etch silicon oxynitride or silicon oxide, or $Cl^-$ or $HBr/O_2$ to etch polycrystalline silicon. Next, a sidewall spacer layer 214 comprising a dielectric material such as, for example, silicon nitride or silicon oxide, is conformally blanket-deposited overlying the surface of semiconductor substrate 200 and sacrificial mandrels 212. Sidewall spacer layer 214 may be deposited in a manner described above with reference to mandrel-forming material layer 210. Preferably, the composition of sidewall spacer layer 214 is chosen such that sacrificial mandrels 212 may be selectively removed by a subsequent etch process without subjecting sidewall spacers formed from sidewall spacer layer 214, discussed below, to further erosion. For example, if mandrel-forming material layer 210 is formed of silicon nitride, sidewall spacer layer 214 may be formed of silicon oxide since sacrificial mandrels 212 may be selectively removed using a heated phosphoric acid/water ($H_3PO_4/H_2O$) solution. Sidewall spacer layer 214 has a thickness of from about 15 nm to about 40 nm for gate lengths of about 25 nm. The actual thickness will depend, at least in part, on the desired critical dimension (CD) of the final fin structure, discussed below.

Figure 4:
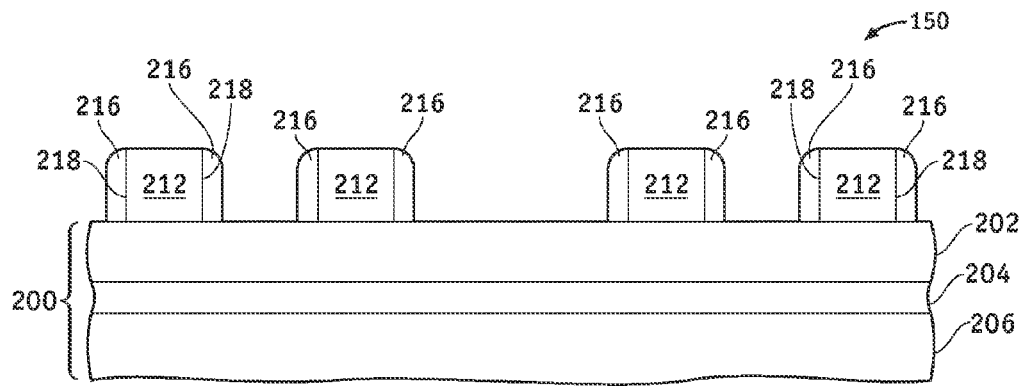
Figure 5:
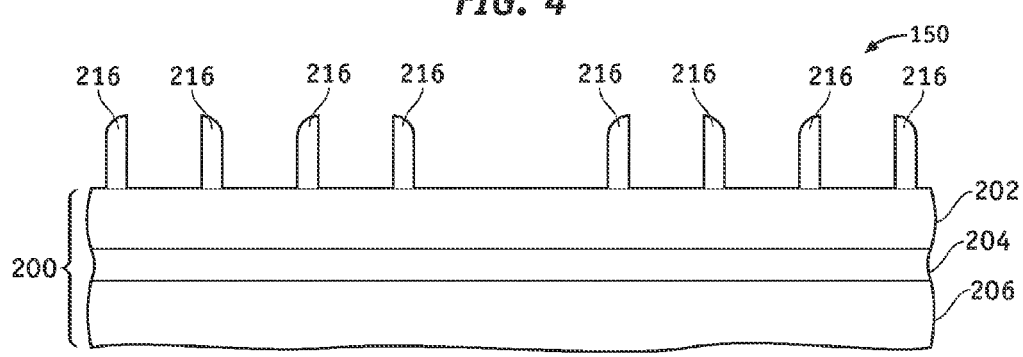
Figure 6:
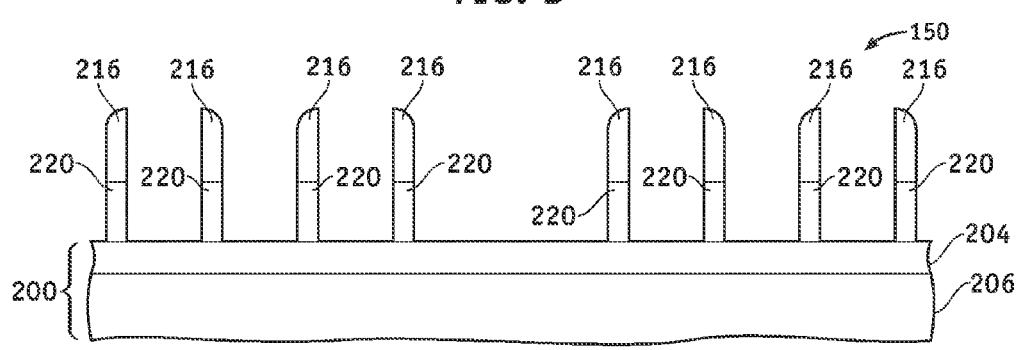

The method continues with the anisotropic etch of sidewall spacer layer 214 to form sidewall spacers 216 adjacent to the sidewalls 218 of sacrificial mandrels 212, as illustrated in FIG. 4. This etch may be performed using the appropriate etch process described above. The sacrificial mandrels 212 then are removed, leaving the sidewall spacers 216 substantially intact, as illustrated in FIG. 5. After removal of sacrificial mandrels 212, silicon-comprising material 202 (and a hard mask if overlying silicon-comprising material 202) is etched using the sidewall spacers as an etch mask to form silicon-comprising fins 220, leaving semiconductor substrate 200 formed of buried oxide layer 204 and silicon substrate 206, as illustrated in FIG. 6. After etching of silicon-comprising material 202 (and/or after etching any overlying hard mask), sidewall spacers 216 may be removed using any suitable wet or dry etch process selective to spacers 216 to avoid erosion of fins 220. Although no shown in FIG. 6, because the mandrels are of a square or rectangular shape, the sidewall spacers and, hence, the fins, are formed in an open square or rectangular shape. Accordingly, after removal of the spacers, a further etch of the fins 220 can be performed to remove the end portions, that is, the portions of the fins out of the plane of FIG. 6 that connect two adjacent parallel fins 220 together. The etch can also remove any unnecessary or undesirable fins. While the formation of eight fins is illustrated in FIG. 6, it will be appreciated that any number of fins suitable for a particular device application may be fabricated.

Figure 7:
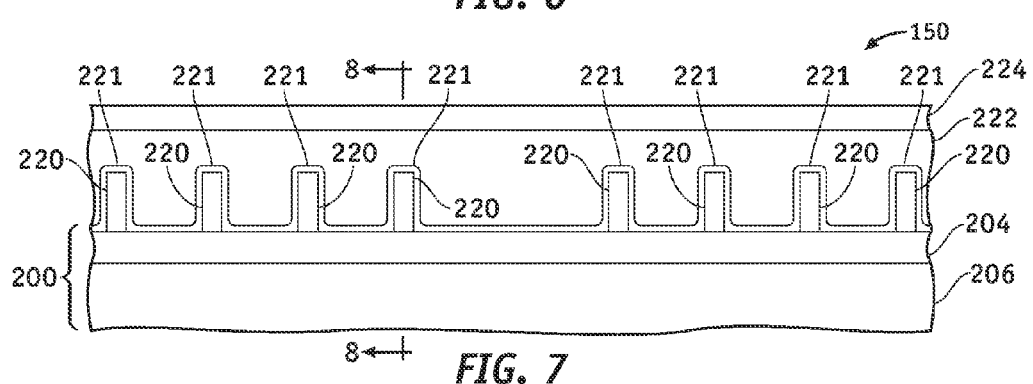
Figure 8:
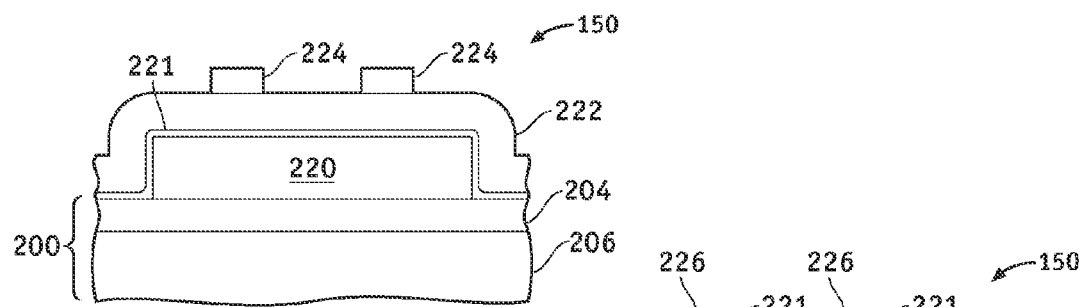

Referring to FIG. 7, in one exemplary embodiment, the method continues with the formation of a gate insulator 221 about the fins 220. The gate insulator 221 may be a thermally grown silicon dioxide formed by heating silicon fins 220 in an oxidizing ambient or, as illustrated, may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), and plasma enhanced chemical vapor deposition (PECVD). In another exemplary embodiment, a gate-forming material layer 222 then is deposited overlying the gate insulator 221 and the fins 220. The gate-forming material layer comprises a conductive material, such as, for example, polycrystalline silicon, one or more metals, a combination thereof, or the like, and has a thickness suitable for a desired device application. A mask 224, such as a photoresist, is deposited overlying gate-forming material layer 222 and is patterned via a photolithography process, as illustrated in FIG. 8. FIG. 8 is a cross-sectional view of the FinFET structure 150 of FIG. 7, taken along axis 8-8.

Figure 9:
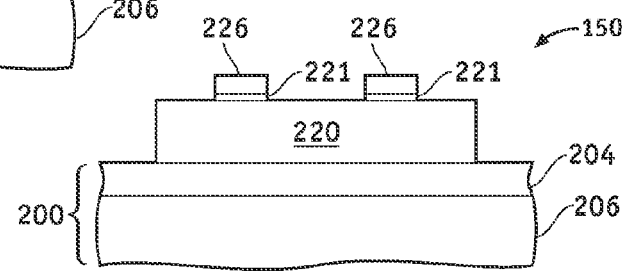
Figure 10:
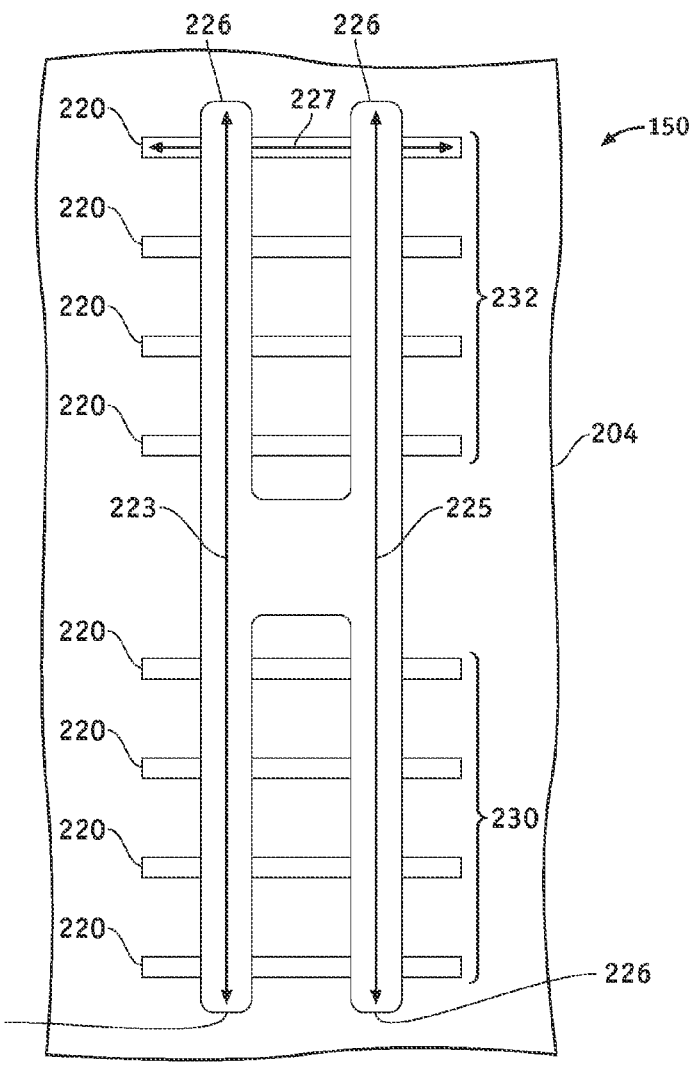

Next, gate-forming material layer 222 is etched to form gate structures 226 overlying fins 220 and the patterned mask 224 is removed, as illustrated in FIG. 9. Gate insulator 221 also may be etched using gate structures 226 as an etch mask. FIG. 10 is a top view of the FinFET structure 150 of FIG. 9. As illustrated in FIG. 10, FinFET structure 150 now comprises four gate structures 226, two of which are integral and formed along a longitudinal axis, indicated by double-headed arrow 223, and two of which are integral and formed along a parallel longitudinal axis 225. While four gate structures are illustrated in FIG. 10, it will be understood that FinFET structure 150 can have any number of gate structures disposed integrally and/or in parallel as required for the device structure being implemented. In addition, FinFET structure 150 comprises a plurality 230 and a plurality 232 of parallel fins 220, each fin of which has a longitudinal axis, indicated by double-headed arrow 227, that is substantially perpendicular to longitudinal axes 223 and 225.

Figure 11:
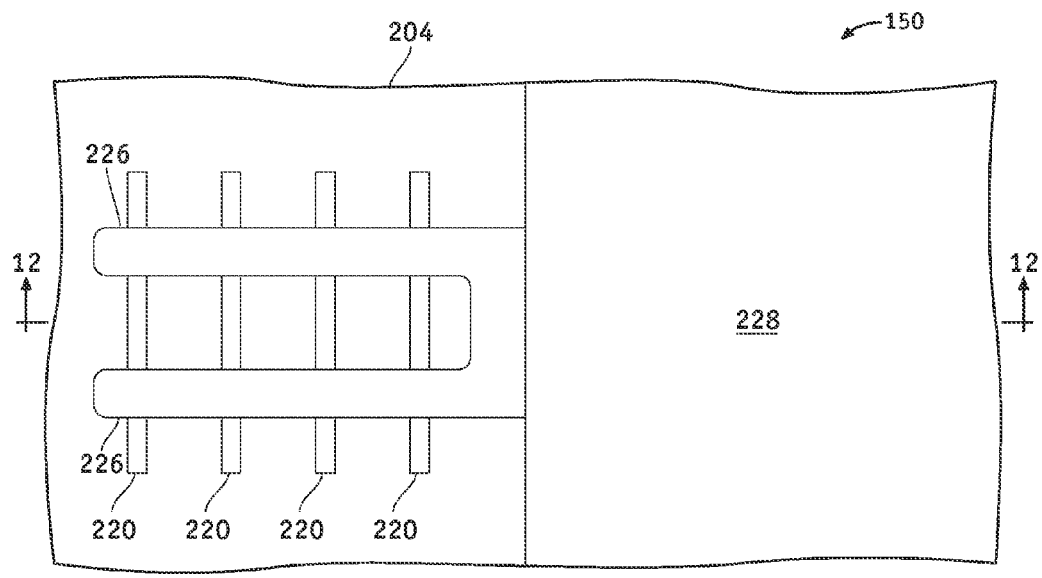
Figure 12:
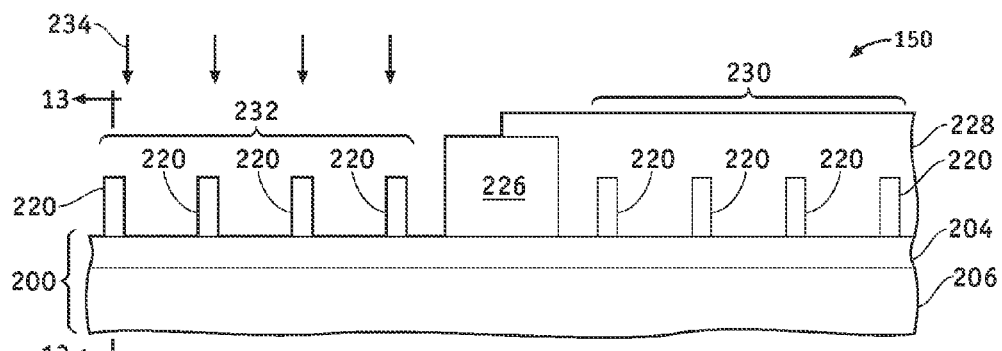
Figure 13:
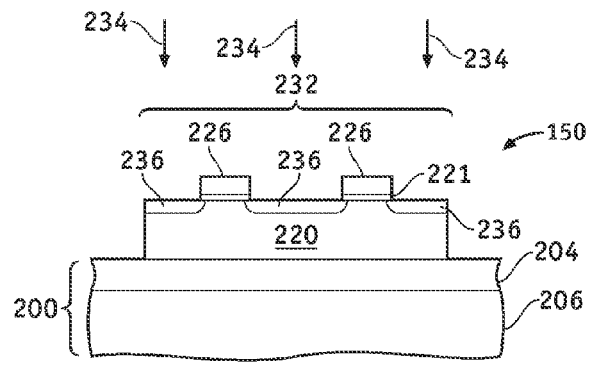

After formation of gate structures 226, a mask 228, such as a hard mask or photoresist, is formed overlying plurality 230 of fins 220, with plurality 232 of fins 220 remaining exposed, as illustrated in FIGS. 11 and 12. FIG. 12 is a cross-sectional view of the FinFET structure 150 of FIG. 11 taken along the 12-12 axis. The mask 228 and the gate structures 226 are used as an ion implantation mask to form source/drain extensions 236 in the fins 220 of exposed plurality 232 by implantation of conductivity-determining ions 234, as illustrated in FIGS. 12 and 13. FIG. 13 is a cross-sectional view of the FinFET structure 150 of FIG. 12 taken along the 13-13 axis. For an n-channel FinFET device, the source/drain extensions 236 are preferably formed by implanting arsenic ions, although phosphorus ions could also be used. For a p-channel FinFET device, the source/drain extensions 236 are preferably formed by implanting boron ions. For brevity, exposed plurality 232 of fins 220 will be referenced as having been implanted for an n-channel FinFET device. The mask 228 then is removed.

Figure 14:
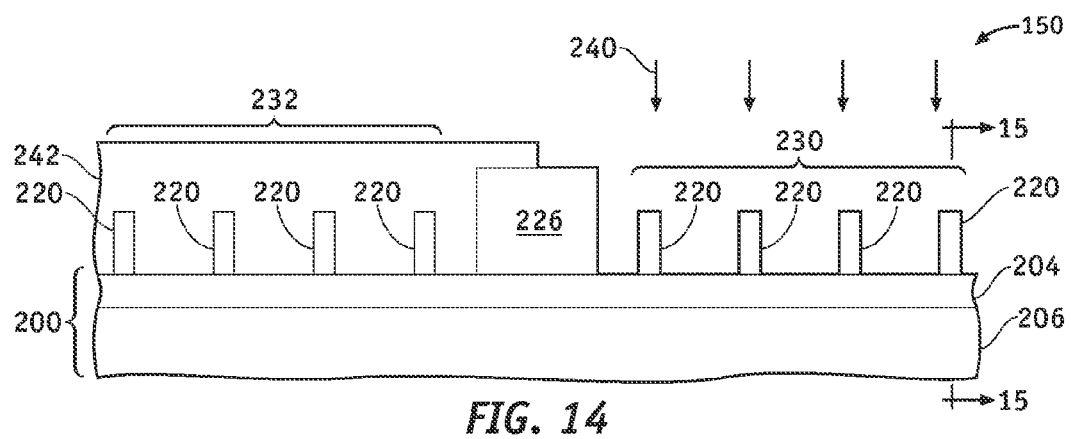
Figure 15:
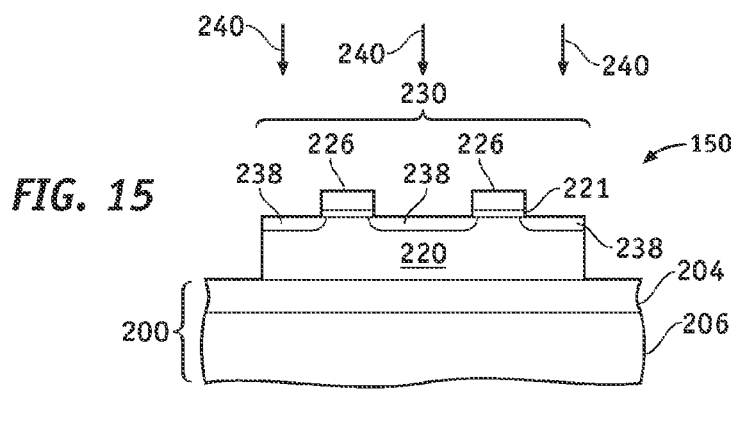

Referring to FIG. 14, which is taken along the same axis as FIG. 12, another mask 242, such as a hard mask or photoresist, is formed overlying the plurality 232 of fins 220, leaving plurality 230 of fins 220 exposed. After formation of mask 242, the mask and the gate structures 226 are used as an ion implantation mask to form source and drain extensions 238 in the fins 220 of exposed plurality 230 by implantation of conductivity-determining ions 240, as illustrated in FIGS. 14 and 15. FIG. 15 is a cross-sectional view of the FinFET structure 150 of FIG. 14 taken along the 15-15 axis. For a p-channel FinFET device, the source/drain extensions 238 are preferably formed by implanting boron ions. After implantation, the mask 242 is removed.

Figure 16:
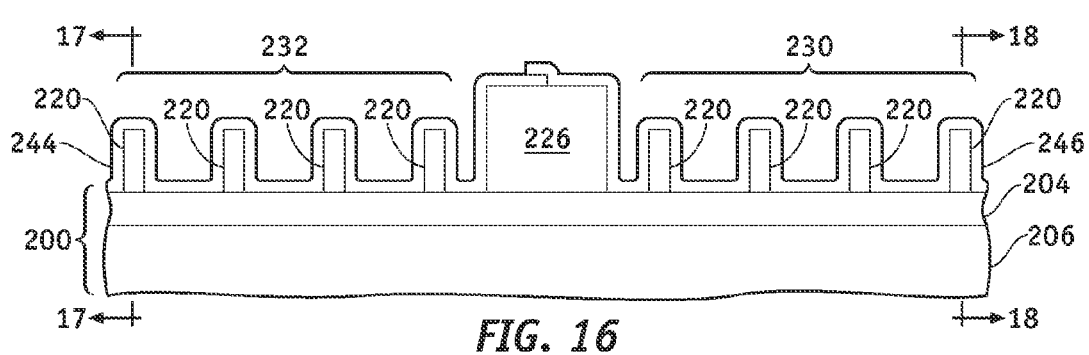
Figure 17:
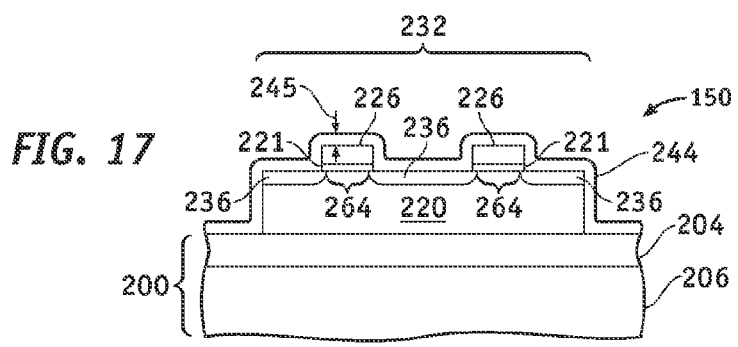
Figure 18:
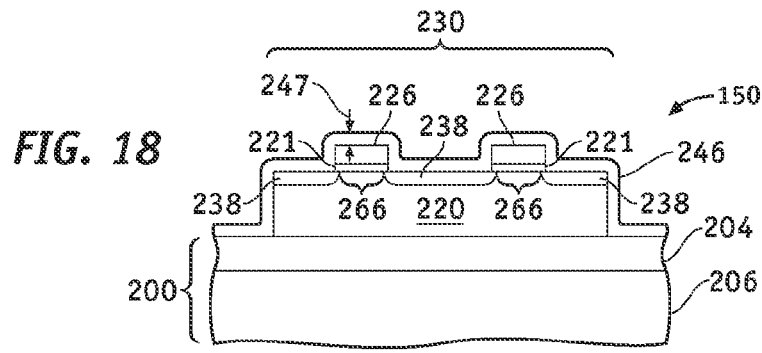

Next, a blanket tensile stress-inducing layer 244 is uniformly and conformally deposited overlying fins 220, gate structures 226, and semiconductor substrate 200, and is subsequently removed from plurality 230 of fins 220, as illustrated in FIG. 16 and FIG. 17. FIG. 16 is a cross-sectional view of FinFET structure 150 taken along the same axis as FIG. 14 and FIG. 17 a cross-sectional view of the FinFET structure 150 of FIG. 16 taken along the 17-17 axis. The tensile stress-inducing layer 244 can be any material that can be formed on the fins and that generates a stress at the interface that is then redistributed in the fins. Tensile stress-inducing material 244 induces a tensile stress in the underlying n-channel fins, which enhances the mobility of carriers, that is, electrons, within the n-channel. A blanket compressive stress-inducing layer 246 is uniformly and conformally deposited overlying plurality 230 of fins 220, gate structures 226, tensile stress-inducing material 244, and buried oxide layer 204, and is subsequently at least substantially removed from tensile stress-inducing material 244, as illustrated in FIG. 16 and FIG. 18. FIG. 18 is a cross-sectional view of the FinFET structure 150 of FIG. 16 taken along axis 18-18. Compressive stress-inducing material 246 induces a compressive stress in the underlying p-channel fins, which enhances the mobility of carriers, that is, holes, within the p-channel. In one exemplary embodiment, the tensile stress-inducing material 244 is a tensile stress-inducing silicon nitride and the compressive stress-inducing material 246 is a compressive stress-inducing silicon nitride, although other materials such as silicon germanium and silicon carbide can be used. Methods for depositing tensile stress-inducing materials and compressive stress-inducing materials are well known in the art and need not be described in further detail here. As discussed in more detail below, the stress-inducing materials 244 and 246 are deposited to thicknesses, indicated by arrows 245 (FIG. 17) and 247 (FIG. 18), respectively, so that spacers formed from the materials have a width that prevents source/drain regions subsequently-formed in the fins from encroaching into channels 264 and 266 between extensions 236 and 238, respectively.

Figure 19:
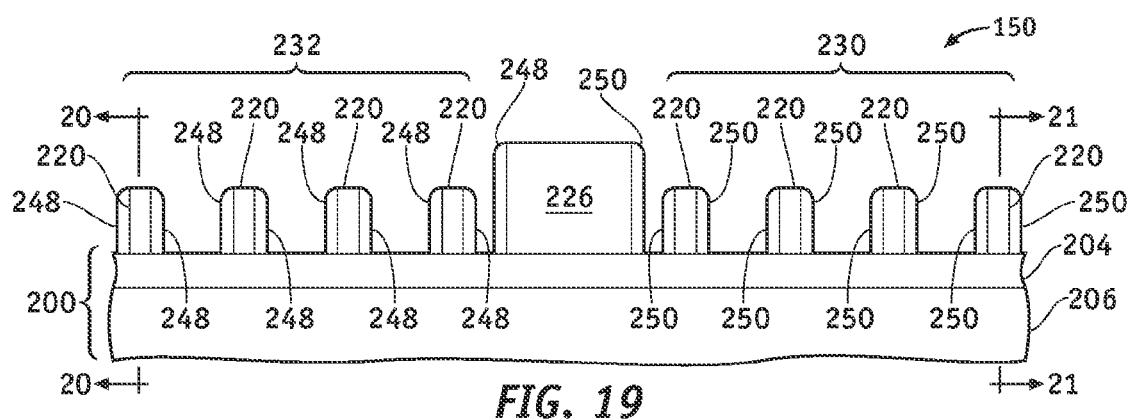
Figure 20:
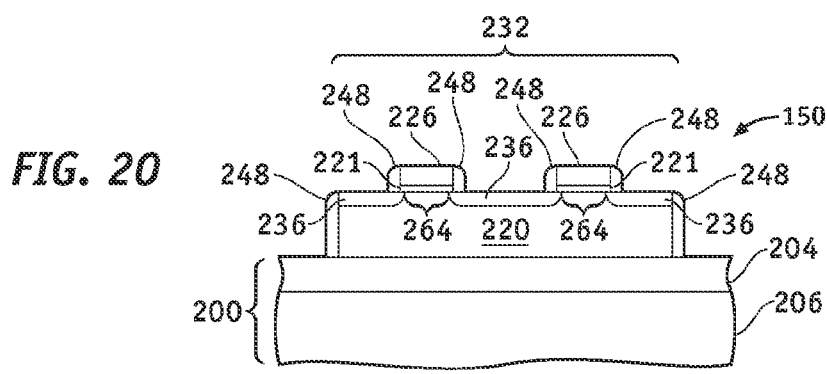
Figure 21:
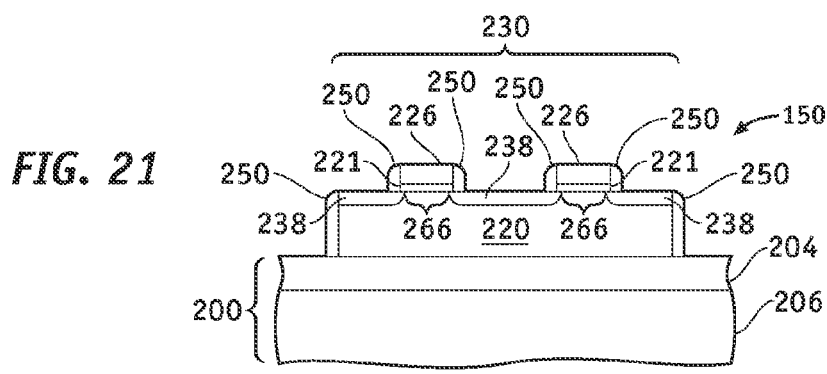

After deposition, the stress-inducing materials 244 and 246 are subjected to an anisotropic etch to form tensile stress-inducing spacers 248 overlying the n-channel impurity-doped extensions 236 and compressive stress-inducing spacers 250 overlying the p-channel impurity-doped extensions 238, as illustrated in FIGS. 19-21. FIG. 19 is a cross-sectional view of the FinFET structure 150 taken along the same axis as FIG. 16. FIG. 20 is a cross-sectional view of the FinFET structure 150 of FIG. 19 taken along the 20-20 axis and FIG. 21 is a cross-sectional view of the FinFET structure 150 of FIG. 19 taken along the 21-21 axis. In a preferred embodiment, stress-inducing spacers 248 and 250 are formed substantially simultaneously, although spacers 248 also can be formed before or after spacers 250.

Figure 22:
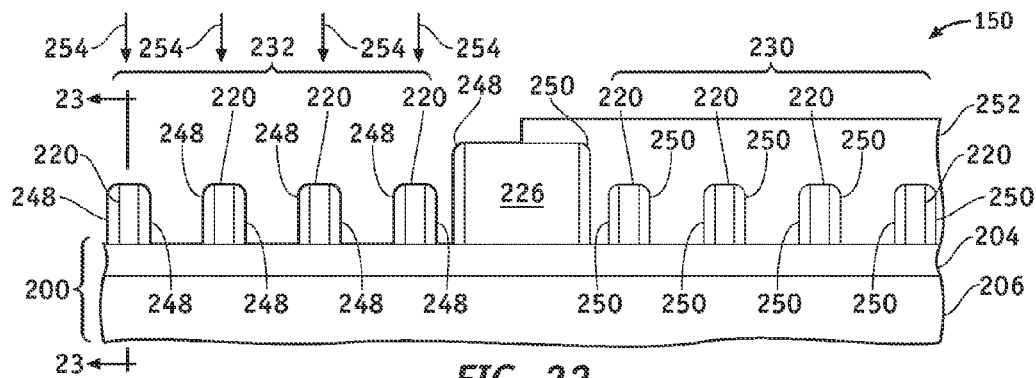
Figure 23:
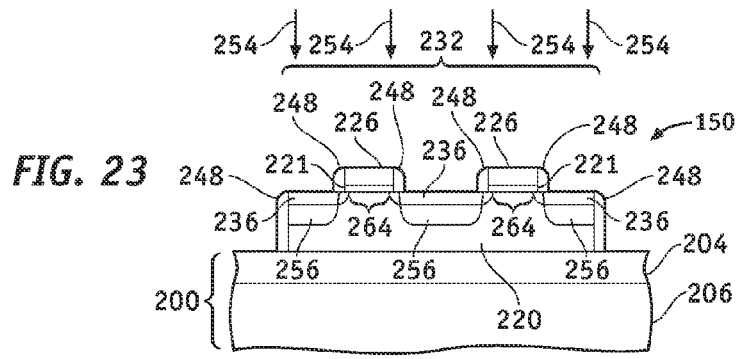

Upon formation of stress-inducing spacers 248 and 250, the method continues with the formation of a mask 252, such as a hard mask or photoresist, overlying plurality 230 of fins 220, as illustrated in FIG. 22, which is a cross-sectional view of the FinFET structure 150 taken along the same axis as FIG. 19. Plurality 232 of fins 220 remains exposed. The mask 252, the stress-inducing spacers 248, and the gate structures 226 are used as an ion implantation mask to form deep source/drain regions 256 in the exposed portion of the fins 220 by implantation of conductivity-determining ions 254, as illustrated in FIGS. 22 and 23. FIG. 23 is a cross-sectional view of the FinFET structure 150 of FIG. 22 taken along the 23-23 axis. For an n-channel FinFET device, the source/drain regions 256 are preferably formed by implanting arsenic ions, although phosphorus ions could also be used. As illustrated in FIG. 23, the stress-inducing spacers 248 can be fabricated with a width, indicated by arrows 249, sufficient to prevent the source/drain regions 256 from diffusing and encroaching into channels 264 that are disposed underlying the gate structures 226 between the source and drain extensions 236. In this regard, device failure is avoided. After source/drain regions 256 are formed, the mask 252 is removed.

Figure 24:
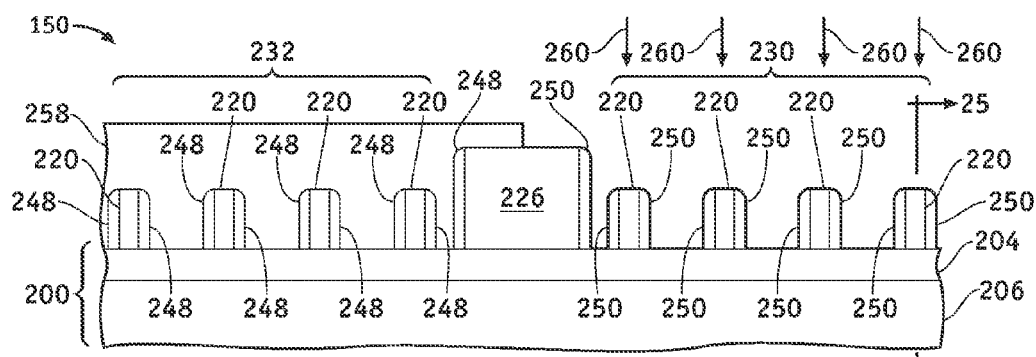
Figure 25:
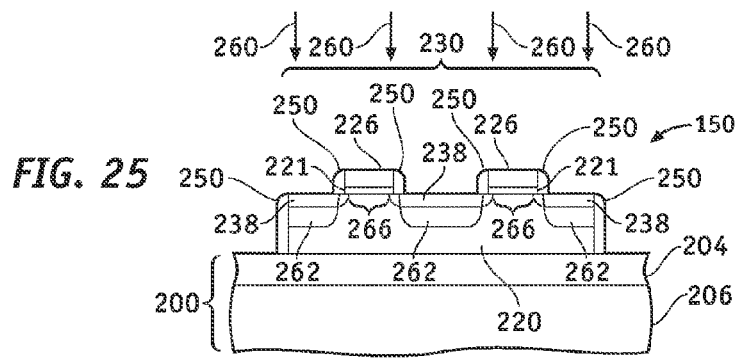
Figure 26:
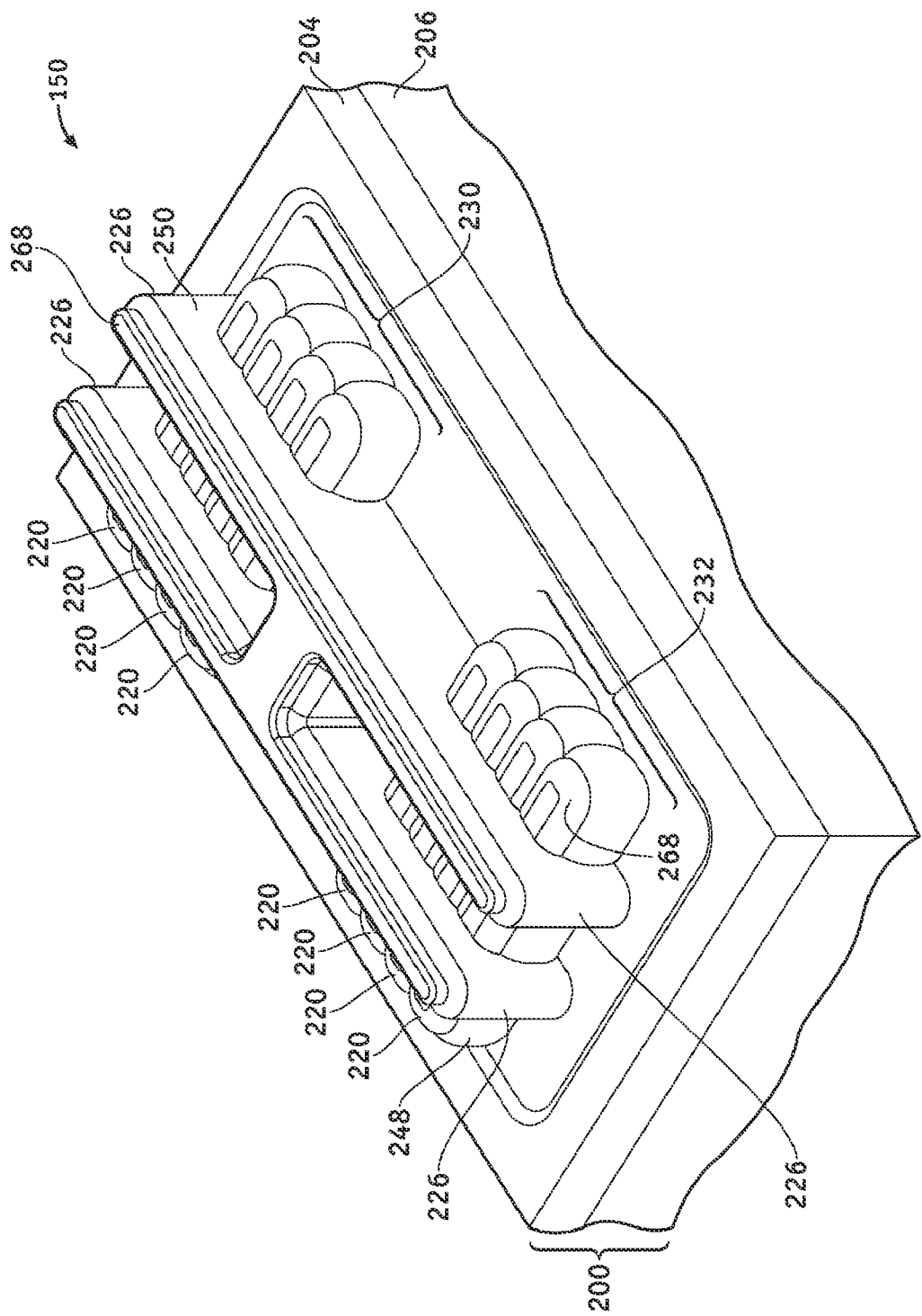

Referring to FIG. 24, which is a cross-sectional view of FinFET structure 150 taken along the same axis as FIG. 22, another mask 258, such as a hard mask or photoresist, is formed overlying the plurality 232 of fins 220, leaving plurality 230 of fins 220 exposed. The mask 258, the gate structures 226, and the stress-inducing spacers 250 then are used as an ion implantation mask to form deep source/drain regions 262 in the exposed plurality 230 of the fins 220 by implantation of conductivity-determining ions 260, as illustrated in FIGS. 24 and 25. FIG. 25 is a cross-sectional view of the FinFET structure 150 of FIG. 24 taken along the 25-25 axis. For a p-channel FinFET device, the source and drain regions 262 are preferably formed by implanting boron ions. As illustrated in FIG. 25, as with stress-inducing spacers 248, the stress-inducing spacers 250 can fabricated with a width, indicated by arrows 251, sufficient to prevent the source/drain regions 262 from diffusing and encroaching into channels 266 that are disposed underlying the gate structures 226 between the source/drain extensions 238. After implantation, the mask 258 then is removed and the FinFET structure 150 can be subjected to an anneal, such as rapid thermal anneal (RTA), to activate the impurities in the source/drain extensions and regions. Thereafter, any number of known process steps can be performed to complete fabrication of the FinFET structure 150. For example, as illustrated in FIG. 26, conductive contacts 268, such as metal silicide contacts, can be formed on the fins 220 and the gate structures 226 as is well known in the art. While the above figures illustrate the formation of n-channel fins, that is, plurality 232 of fins 220, before the formation of p-channel fins, that is, plurality 230 of fins 220, it will be appreciated that the formation of p-channel fins before the formation of n-channel fins also is contemplated herein. Further, while the fabrication of a FinFET structure having both n-channel fins and p-channel fins is illustrated in the figures, it will be appreciated that a FinFET structure having only n-channel fins or only p-channel fins also can be fabricated using the methods as described above.

Accordingly, as illustrated in FIGS. 22-26, stress-inducing spacers 248 can be fabricated from tensile stress-inducing material overlying the source/drain extensions 236 of n-channel fins (plurality 232 of fins 220) and stress-inducing spacers 250 can be fabricated from compressive stress-inducing material overlying the source/drain extensions 238 of p-channel fins (plurality 230 of fins 220). The stress-inducing spacers 248 and 250 serve not only to space the source/drain regions so that they do not encroach upon the channels of the fins but also serve to induce stress into the channels 264 and 266, respectively. In this regard, even though the area between gates may be relatively small, because the stress-inducing spacers serve two purposes, efficient use is made of the area so that optimally performing but scalable FinFET devices can be fabricated. In addition, the formation of the stress-inducing spacers integrates well into the FinFET fabrication process because the spacers are formed after the both the fins and the gates are formed.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a FinFET structure, the method comprising the steps of:
   fabricating a plurality of parallel fins overlying a semiconductor substrate, each of the plurality of parallel fins having sidewalls;
   fabricating a gate structure overlying a portion of each of the plurality of parallel fins, wherein the gate structure has sidewalls and overlies channels within the plurality of parallel fins;
   forming stress-inducing sidewall spacers abutting the sidewalls of the plurality of parallel fins and the sidewalls of the gate structure, wherein the stress-inducing sidewall spacers induce a stress within the channels; and
   implanting first conductivity-determining ions into the plurality of parallel fins using the stress-inducing sidewall spacers and the gate structure as an implantation mask to form source and drain regions within the plurality of parallel fins.

2. The method of claim 1, wherein each of the plurality of parallel fins has a first longitudinal axis and wherein the step of fabricating a gate structure comprises forming a gate structure having a second longitudinal axis substantially perpendicular to the first longitudinal axis.

3. The method of claim 1, further comprising the step of implanting second conductivity-determining ions into the plurality of parallel fins, the step of implanting second conductivity-determining ions performed before the step of forming stress-inducing sidewall spacers and after the step of fabricating the gate structure.

4. The method of claim 1, further comprising the step of forming a gate insulator abutting the sidewalls of each of the plurality of parallel fins, the step of forming the gate insulator performed before the step of fabricating a gate structure.

5. The method of claim 1, wherein the step of forming stress-inducing sidewall spacers comprises forming the stress-inducing sidewall spacers with a width of sufficient magnitude so that, after the step of implanting, the source and drain regions do not encroach upon the channels within the plurality of parallel fins.

6. The method of claim 1, wherein the step of forming stress-inducing sidewall spacers comprises forming tensile stress-inducing sidewall spacers.

7. The method of claim 1, wherein the step of forming stress-inducing sidewall spacers comprises forming compressive stress-inducing sidewall spacers.

8. The method of claim 1, wherein the semiconductor substrate comprises a semiconductor material and wherein the step of fabricating a plurality of parallel fins comprises the steps of:
   forming sacrificial mandrels overlying the semiconductor material;
   forming a sidewall spacer-forming material overlying the sacrificial mandrels;
   anisotropically etching the sidewall spacer-forming material to form sidewall spacers;
   removing the sacrificial mandrels, leaving the sidewall spacers substantially intact; and
   etching the semiconductor material using the sidewall spacers as an etch mask.

9. The method of claim 1, wherein the step of fabricating a gate structure comprises the steps of:
   forming a blanket layer of conductive material overlying the plurality of parallel fins;
   forming a patterned mask overlying the blanket layer of conductive material; and
   etching the blanket layer of conductive material.

10. A method for fabricating a FinFET structure, the method comprising the steps of:
   fabricating parallel fins overlying a semiconductor substrate, each of the parallel fins having sidewalls;
   fabricating a gate structure overlying a first portion of each of the parallel fins with a second portion of each of the parallel fins exposed, wherein the gate structure has sidewalls;
   forming first stress-inducing sidewall spacers abutting the sidewalls of a first plurality of the parallel fins and the sidewalls of a first portion of the gate structure;
   forming second stress-inducing sidewall spacers abutting the sidewalls of a second plurality of the parallel fins and the sidewalls of a second portion of the gate structure, wherein the first stress-inducing sidewall spacers and the second stress-inducing sidewall spacers induce opposite stresses;
   implanting first conductivity-determining ions into the second portion of the first plurality of the parallel fins using the first stress-inducing sidewall spacers and the first portion of the gate structure as an implantation mask to form first source and drain regions; and
   implanting second conductivity-determining ions into the second portion of the second plurality of the parallel fins using the second stress-inducing sidewall spacers and the second portion of the gate structure as an implantation mask to form second source and drain regions, wherein the first conductivity-determining ions are of an opposite conductivity than the second conductivity-determining ions.

11. The method of claim 10, wherein the step of forming the first stress-inducing sidewall spacers comprises forming the first stress-inducing sidewall spacers from one of a tensile stress-inducing material or a compressive stress-inducing material and the step of forming the second stress-inducing sidewall spacers comprises forming the second stress-inducing sidewall spacers from the other of the tensile stress-inducing material or the compressive stress-inducing material.

12. The method of claim 10, wherein the step of forming first stress-inducing sidewall spacers comprises forming the first stress-inducing sidewall spacers with a width of sufficient magnitude so that, after the step of implanting the first conductivity-determining ions, the first source and drain regions do not encroach upon channels within the first portion of the first plurality of the parallel fins underlying the first portion of the gate structure.

13. The method of claim 10, wherein the step of forming second stress-inducing sidewall spacers comprises forming the second stress-inducing sidewall spacers with a width of sufficient magnitude so that, after the step of implanting second conductivity-determining ions, the second source and drain regions do not encroach upon channels within the first portion of the second plurality of the parallel fins underlying the second portion of the gate structure.

14. The method of claim 10, further comprising the step of implanting third conductivity-determining ions into the second portion of the first plurality of the parallel fins using the first portion of the gate structure as an implantation mask to form first source and drain extensions, the step of implanting third conductivity-determining ions performed before the step of forming first stress-inducing sidewall spacers, wherein both the third conductivity-determining ions and the first conductivity-determining ions are of the same conductivity-determining type.

15. The method of claim 10, further comprising the step of implanting fourth conductivity-determining ions into the second portion of the second plurality of the parallel fins using the second portion of the gate structure as an implantation mask to form second source and drain extensions, the step of implanting the fourth conductivity-determining ions performed before the step of forming second stress-inducing sidewall spacers, wherein both the fourth conductivity-determining ions and the second conductivity-determining ions are of the same conductivity-determining type.

16. The method of claim 10, wherein each of the parallel fins has a first longitudinal axis and wherein the step of fabricating a gate structure comprises forming a gate structure having a second longitudinal axis substantially perpendicular to the first longitudinal axis.

17. The method of claim 10, further comprising the step of forming a gate insulator overlying the first portion of the parallel fins, the step of forming the gate insulator performed before the step of fabricating a gate structure.

18. The method of claim 10, wherein the step of fabricating parallel fins comprises the steps of:
   forming a semiconductor material overlying the semiconductor substrate;
   forming sacrificial mandrels overlying the semiconductor material;
   forming a sidewall spacer-forming material overlying the sacrificial mandrels;
   anisotropically etching the sidewall spacer-forming material to form sidewall spacers;
   removing the sacrificial mandrels leaving the sidewall spacers substantially intact; and
   etching the semiconductor material using the sidewall spacers as an etch mask.

19. The method of claim 10, wherein the step of forming first stress-inducing sidewalls spacers and the step of forming second stress-inducing sidewall spacers are performed substantially simultaneously.

20. A FinFET structure comprising:
- a plurality of parallel fins overlying a semiconductor substrate, each of the plurality of parallel fins having sidewalls;
- a gate structure overlying a first portion of each of the plurality of parallel fins, the gate structure having sidewalls;
- source and drain regions disposed within a second portion of each of the plurality of parallel fins; and
- stress-inducing sidewall spacers abutting the sidewalls of the second portion of each of the plurality of parallel fins and about the sidewalls of the gate structure, wherein the stress-inducing sidewall spacers have a width such that the source and drain regions do not encroach upon a channel of each of the plurality of parallel fins underlying the gate structure.

* * * * *